US012787527B2

(12) United States Patent
Ting et al.

(10) Patent No.: US 12,787,527 B2
(45) Date of Patent: Nov. 3, 2026

(54) STACKED LIGHT EMITTING DEVICE

(71) Applicant: RAYLEIGH VISION INTELLIGENCE CO. LTD., Hsinchu City (TW)

(72) Inventors: Shao-Ying Ting, New Taipei City (TW); Jr-Hau He, Hsinchu City (TW); Guang-Wei Chung, Taoyuan City (TW); Zhi-Ting Ye, Miaoli County (TW)

(73) Assignee: RAYLEIGH VISION INTELLIGENCE CO. LTD., Hsinchu City (TW)

( * ) Notice: Subject to any disclaimer, the term of this patent is extended or adjusted under 35 U.S.C. 154(b) by 218 days.

(21) Appl. No.: 18/746,085

(22) Filed: Jun. 18, 2024

(65) Prior Publication Data

US 2025/0386622 A1 Dec. 18, 2025

(51) Int. Cl.

| | |
|---|---|
| ***H10H 20/857*** | (2025.01) |
| ***H10H 20/01*** | (2025.01) |
| ***H10H 20/83*** | (2025.01) |
| ***H10K 59/80*** | (2023.01) |
| ***H10W 72/90*** | (2026.01) |
| ***H10W 90/00*** | (2026.01) |
| *H10H 29/80* | (2025.01) |

(Continued)

(52) U.S. Cl.

CPC .......... *H10H 20/857* (2025.01); *H10H 20/83* (2025.01); *H10K 59/805* (2023.02); *H10W 72/944* (2026.01); *H10W 90/00* (2026.01); *H10H 20/0364* (2025.01); *H10H 29/857* (2025.01); *H10H 29/962* (2025.01); *H10W 72/019* (2026.01); *H10W 72/922* (2026.01)

(58) Field of Classification Search

CPC .. H10H 20/857; H10H 20/0364; H10H 20/83; H10H 29/962; H10H 29/857; H10W 90/00; H10W 72/944; H10W 72/922; H10W 72/019; H10W 70/655; H10K 59/805

See application file for complete search history.

(56) References Cited

U.S. PATENT DOCUMENTS 11,587,914 B2 * 2/2023 Jang .................... H10H 20/018
11,626,391 B2 * 4/2023 Chae ..................... H10D 86/00 257/79

(Continued)

*Primary Examiner* — Alonzo Chambliss
(74) *Attorney, Agent, or Firm* — WPAT, PC

(57) ABSTRACT

A stacked light emitting device having a first light emitting layer, a second light emitting layer, a third light emitting layer, and an upper substrate is provided. A first common electrode and a first fan-out electrode of the first light emitting layer are electrically connected to an upper side of a first light emitting element. A second common electrode and a second fan-out electrode of the second light emitting layer are electrically connected to an upper side of a second light emitting element. A third common electrode and a third fan-out electrode of the third light emitting layer are electrically connected to an upper side of a third light emitting element. The first common electrode, the first fan-out electrode, the second fan-out electrode, and the third fan-out electrode are extending through multiple layers to a lower side of a first insulating layer and located at the same plane.

10 Claims, 6 Drawing Sheets

1

(51) Int. Cl.
*H10H 29/85* (2025.01)
*H10W 72/00* (2026.01)

(56) References Cited

U.S. PATENT DOCUMENTS

| | | | | |
|---|---|---|---|---|
| 2010/0051975 | A1* | 3/2010 | Suzuki | H10W 90/00<br>257/E33.056 |
| 2020/0219858 | A1* | 7/2020 | Chang | H10H 20/018 |
| 2023/0106914 | A1* | 4/2023 | Jang | H10H 20/852<br>257/91 |

* cited by examiner

STACKED LIGHT EMITTING DEVICE

FIELD OF THE INVENTION

The present invention relates to a stacked light emitting device, especially to a vertically stacked light emitting device with vertically conductive and stacked electrodes.

BACKGROUND OF THE INVENTION

At early days, light emitting diode technology is applied to simple display device because its high brightness and low power consumption features are more suitable for these small displays. These early applications lay a foundation for applications of LED to larger displays.

One of the important applications of LED to the display is used as a back light source. Liquid crystal display (LCD) needs the back light source to produce visible images. In the past, the LCD uses cold cathode fluorescent light (CCFL) as the back light source. Yet as the back light source, LEDs have advantages of lower power consumption, longer lifetime, smaller volume, and controllable color rendering.

Among the LED, organic light emitting diode (OLED) and micro light emitting diode (MicroLED) have been further developed.

The light source of the OLED is made from organic materials and able to provide darker black levels and higher contrast ratios, thus no back light source is required. The OLED are widely used in high-end TVs and smart phones.

Micro light-emitting diode (LED) is an emerging display technology consisting of tiny light emitting chips. Compared with LED or OLED (organic light emitting diode) display technology available now, the micro LED provides not only higher brightness, higher contrast ratio, and greater color performance, but also better efficiency and longer lifetime.

The micro LED has huge advantages over other display technologies available now. First are brightness and contrast. The brightness of micro LED can be up to 10 times of the general OLED and the contrast is also higher. Thereby the micro LED display has significant improvement on color reproduction and image quality.

Another advantage of the micro LED is color performance. Since the micro LED display uses pure light source, it shows a wider color gamut, making colors more real and vivid. At the same time, the micro LED display enables local dimming which means brightness adjustment at individual zones of the same screen. Thereby better contrast ratio and higher efficiency are achieved.

A further advantage is regrading efficiency and longer lifetime. The micro LED uses pure light sources so that backlight and color filter are not required. The light-extraction efficiency is improved.

Owing to the advantages mentioned above, the micro LED has become first choice for many high-end display products including smart phones, tablets, televisions, virtual reality (VR)/augmented reality (AR) helmet, car dashboard displays, etc.

With increasing demands for displays with better quality and high resolution, the micro LED technology is getting more and more attention. Compared with conventional liquid crystal displays, LED displays, and OLED displays, the micro LED display is considered as the next generation of display technology because of its higher brightness, better contrast ratio, and a wider color space.

The advantages of the micro LED are also reflected in reliability and long-term cost. The micro LED has long lifetime and high durability so that it's more economical than other technologies. Moreover, the micro LED maintains high quality display for a long time because of its low power consumption and long service time, without much maintenance and replacement of parts.

However, an area of the conventional micro LED is difficult to be minimized due to parallel arrangement of red LED, green LED and blue LED. In order to meet a requirement for more compact design of electronic products, manufacturers need a micro LED with an effectively-reduced area of light emitting surface.

In order to solve the problems of the conventional technique mentioned above, a stacked light emitting device is provided by the present invention. The stacked light emitting device includes a light emitting layer composed of a light emitting element and an insulating layer. Another light emitting layer is stacked over the light emitting layer. The light emitting elements of the respective light emitting layers share one electrode while the other electrodes of the respective light emitting layers transmit electrical signals of the respective light emitting layers to the same plane.

SUMMARY

Therefore, it is a primary object of the present invention to provide a stacked light emitting device which includes a light emitting layer having a light emitting element and an insulating layer and another light emitting layer stacked over the light emitting layer. The respective light emitting elements of the light emitting layers share one electrode while the other electrodes of the respective light emitting layers extend through the insulating layer to achieve vertically conductive and stacked electrodes for transmitting electrical signals of the respective light emitting layers to the same plane.

In order to achieve the above object, a stacked light emitting device 1 according to the present invention includes a first light emitting layer, a first transparent gel layer, a second light emitting layer, a second transparent gel layer, a third light emitting layer, and an upper substrate. The first light emitting layer consists of a first light emitting element, a first insulating layer covering an outer side of the first light emitting element, and a first common electrode electrically connected to an upper side of the first light emitting element. The first common electrode extends through the first insulating layer to be arranged at a lower side of the first insulating layer. The first fan-out electrode is electrically connected to the upper side of the first light emitting element and extending through the first insulating layer to be disposed at the lower side of the first insulating layer. The first transparent gel layer is disposed over the first light emitting layer and the second light emitting layer is arranged over the first transparent gel layer. The second light emitting layer is composed of a second light emitting element, a second insulating layer covering an outer side of the second light emitting element, and a second common electrode electrically connected to an upper side of the second light emitting element. The second common electrode extends through the second insulating layer to be electrically connected with the first common electrode. A second fan-out electrode is electrically connected to the upper side of the second light emitting element and extending through the first insulting layer and the second insulating layer to be disposed on the lower side of the first insulating layer. The second transparent gel layer is disposed over the second light emitting layer and the third light emitting layer is arranged over the second transparent gel layer. The third light emitting layer consists of a third light emitting element, a third common electrode electrically connected to a lower side of the third light emitting element and electrically connected with the second common electrode, and a third fan-out electrode electrically connected to the lower side of the third light emitting element. The third fan-out electrode extends through the first insulting layer and the second insulating layer to be disposed on the lower side of the first insulating layer. The upper substrate is arranged over the third light emitting layer. Thereby the vertically stacked light emitting device is provided.

Preferably, the third light emitting layer further includes a third insulating layer which covers an outer side of the third light emitting element. The third fan-out electrode extends through the first insulting layer, the second insulating layer, and the third insulating layer to be disposed at the lower side of the first insulating layer.

Preferably, the third common electrode extends through the third insulating layer.

Preferably, an area of the third light emitting element is larger than both an area of the first light emitting element and an area of the second light emitting element.

Preferably, the stacked light emitting device further includes a lower substrate which is arranged under the first light emitting layer. The lower substrate is composed of a common substrate electrode, a first substrate electrode, a second substrate electrode, and a third substrate electrode which are respectively electrically connected with the first common electrode, the first fan-out electrode, the second fan-out electrode, and the third fan-out electrode.

Preferably, a conductive member is disposed between the first common electrode and the second common electrode and another conductive member is arranged between the second common electrode and the third common electrode.

Preferably, a further conductive member is disposed between the second fan-out electrode located at the second light emitting layer and the second fan-out electrode located at the first light emitting layer. A further conductive member is arranged between the third fan-out electrode located at the third light emitting layer and the third fan-out electrode located at the second light emitting layer. A further conductive member is disposed between the third fan-out electrode located at the second light emitting layer and the third fan-out electrode located at the first light emitting layer.

Preferably, the first transparent gel layer, the second transparent gel layer, and the conductive members are made of Anisotropic Conductive Film (ACF).

Preferably, the upper substrate is made of transparent materials.

Preferably, the first insulting layer, the second insulating layer, and the third insulating layer are made of polyimide (PI), benzocyclobutene (BCB), polybenzoxazole (PBO), or a combination thereof.

DETAILED DESCRIPTION

In order to solve the problems of the conventional technique mentioned above, the present invention provides a stacked light emitting device. A first common electrode and a first fan-out electrode of a first light emitting layer are electrically connected to an upper side of a first light emitting element. A second common electrode and a second fan-out electrode of a second light emitting layer are electrically connected to an upper side of a second light emitting element. A third common electrode and a third fan-out electrode of a third light emitting layer are electrically connected to an upper side of a third light emitting element. The first common electrode, the first fan-out electrode, the second fan-out electrode, and the third fan-out electrode extend to a lower side of a first insulating layer so that the electrodes are located at the same plane. Thereby the problem of the conventional micro LED having difficulties in further reduction of area can be solved.

Figure 1:
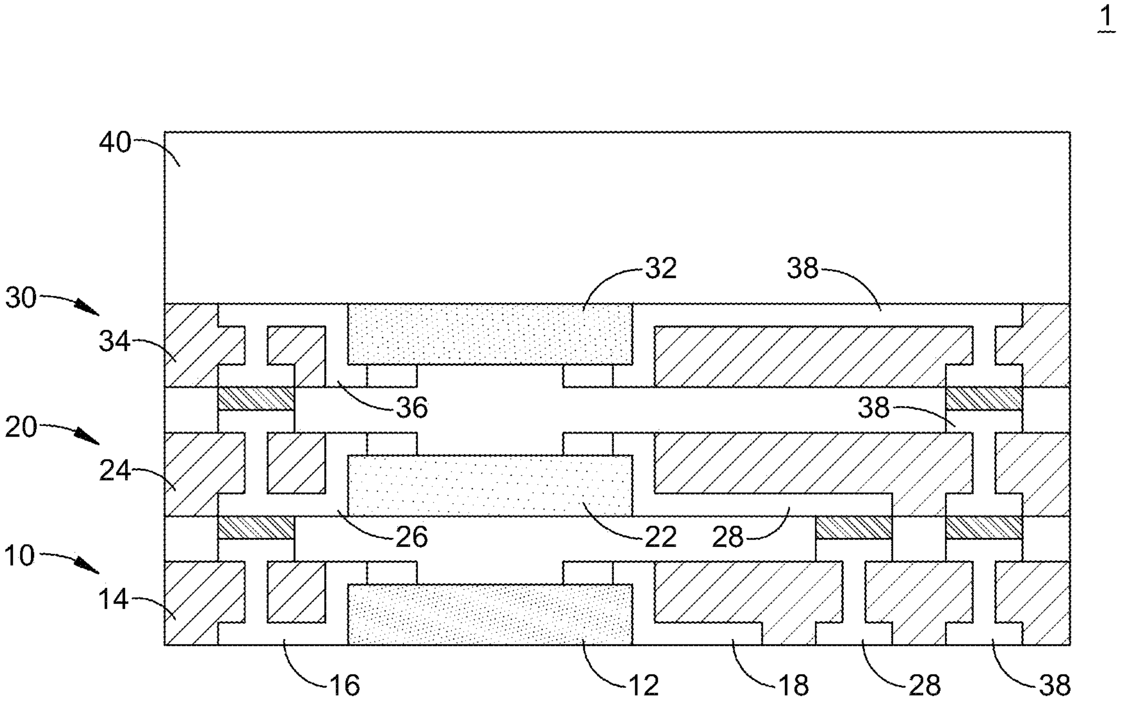
FIG. 1 is a schematic drawing showing structure of an embodiment according to the present invention.

Refer to FIG. 1, a first embodiment of a stacked light emitting device 1 according to the present invention includes a first light emitting layer 10, a first transparent gel layer G1, a second light emitting layer 20, a second transparent gel layer G2, a third light emitting layer 30, and an upper substrate 40.

Still refer to FIG. 1, in this embodiment, the first light emitting layer 10 consists of a first light emitting element 12, a first insulating layer 14, a first common electrode 16, and a first fan-out electrode 18. The first insulating layer 14 covers an outer side of the first light emitting element 12 and the first common electrode 16 is electrically connected to an upper side of the first light emitting element 12 and extending through the first insulating layer 14 to be arranged at a lower side of the first insulating layer 14. The first fan-out electrode 18 is electrically connected to the upper side of the first light emitting element 12 and extending through the first insulating layer 14 to be disposed at the lower side of the first insulating layer 14.

The first transparent gel layer G1 is disposed over the first light emitting layer 10 and the second light emitting layer 20 is arranged over the first transparent gel layer G1. Thus the first light emitting layer 10 and the second light emitting layer 20 are stacked with the first transparent gel layer G1 filled therebetween. The second light emitting layer 20 consists of a second light emitting element 22, a second insulating layer 24, a second common electrode 26, and a second fan-out electrode 28. The second insulating layer 24 covers an outer side of the second light emitting element 22 and the second common electrode 26 is electrically connected to an upper side of the second light emitting element 22 and extending through the second insulating layer 24 to be electrically connected with the first common electrode 16. The second fan-out electrode 28 is electrically connected to the upper side of the second light emitting element 22 and extending through the second insulating layer 24 and the first insulting layer 14 to be disposed on the lower side of the first insulating layer 14. Thereby a bump of the second fan-out electrode 28 and a bump of the first fan-out electrode 18 are at the same plane.

The second transparent gel layer G2 is disposed over the second light emitting layer 20 and the third light emitting layer 30 is arranged over the second transparent gel layer G2. Thus the third light emitting layer 30, the second light emitting layer 20, and the first light emitting layer 10 are stacked with the first transparent gel layer G1 and the second transparent gel layer G2 filled between the two adjacent light emitting layers. The third light emitting layer 30 is composed of a third light emitting element 32, a third common electrode 36, and a third fan-out electrode 38. The third common electrode 36 is electrically connected to both a lower side of the third light emitting element 32 and the second common electrode 26. The third fan-out electrode 38 is electrically connected to the lower side of the third light emitting element 32 and extending through the second insulating layer 24 and the first insulting layer 14 to be disposed on the lower side of the first insulating layer 14. Thereby a bump of the third fan-out electrode 38, the bump of the second fan-out electrode 28, and the bump of the first fan-out electrode 18 are at the same plane. The upper substrate 40 is arranged over the third light emitting layer 30 for protecting the first light emitting layer 10, the second light emitting layer 20, and the third light emitting layer 30 correspondingly.

The first transparent gel layer G1 is disposed between the first light emitting layer 10 and the second light emitting layer 20 and covering all components between the first light emitting layer 10 and the second light emitting layer 20 for providing protection and electrical insulation. The second transparent gel layer G2 is arranged between the second light emitting layer 20 and the third light emitting layer 30 and covering all components between the second light emitting layer 20 and the third light emitting layer 30 for providing protection and electrical insulation.

In this embodiment, the first light emitting element 12, the second light emitting element 22, and the third light emitting element 32 are all light emitting device (LED). The first light emitting element 12, the second light emitting element 22, and the third light emitting element 32 can be one of light emitting diodes (LED) of a micro LED panel.

Light respectively emitted from the first light emitting element 12, the second light emitting element 22, and the third light emitting element 32 have different wavelengths. For example, the first light emitting element 12, the second light emitting element 22, and the third light emitting element 32 are respectively a red-right LED, a green LED, and a blue LED.

The first light emitting element 12, the second light emitting element 22, and the third light emitting element 32 are LEDs made of gallium nitride (GaN).

The upper substrate 40 is made from transparent materials such as sapphire, glass, silica gel, and epoxy resin.

In a preferred embodiment, the third light emitting layer 30 further includes a third insulating layer 34 which covers an outer side of the third light emitting element 32. The third fan-out electrode 38 extends through the third insulting layer 34, the second insulating layer 24, and the first insulating layer 14 to be disposed at the lower side of the first insulating layer 14. Thereby the bump of the third fan-out electrode 38, the bump of the second fan-out electrode 28, and the bump of the first fan-out electrode 18 are located at the same plane.

In a preferred embodiment, the first insulting layer 14, the second insulating layer 24, and the third insulating layer 34 are made of insulating materials such as polyimide (PI), benzocyclobutene (BCB), and polybenzoxazole (PBO). The materials used must have good thermal stability, mechanical properties, chemical resistance, and electrical insulating property.

In a preferred embodiment, the first insulting layer 14, the second insulating layer 24, and the third insulating layer 34 respectively are not completely covering the upper side and a lower side of the first light emitting element 12, the upper side and a lower side of the second light emitting element 22, an upper side and the lower side of the third light emitting element 32 for allowing light to pass through.

Figure 2:
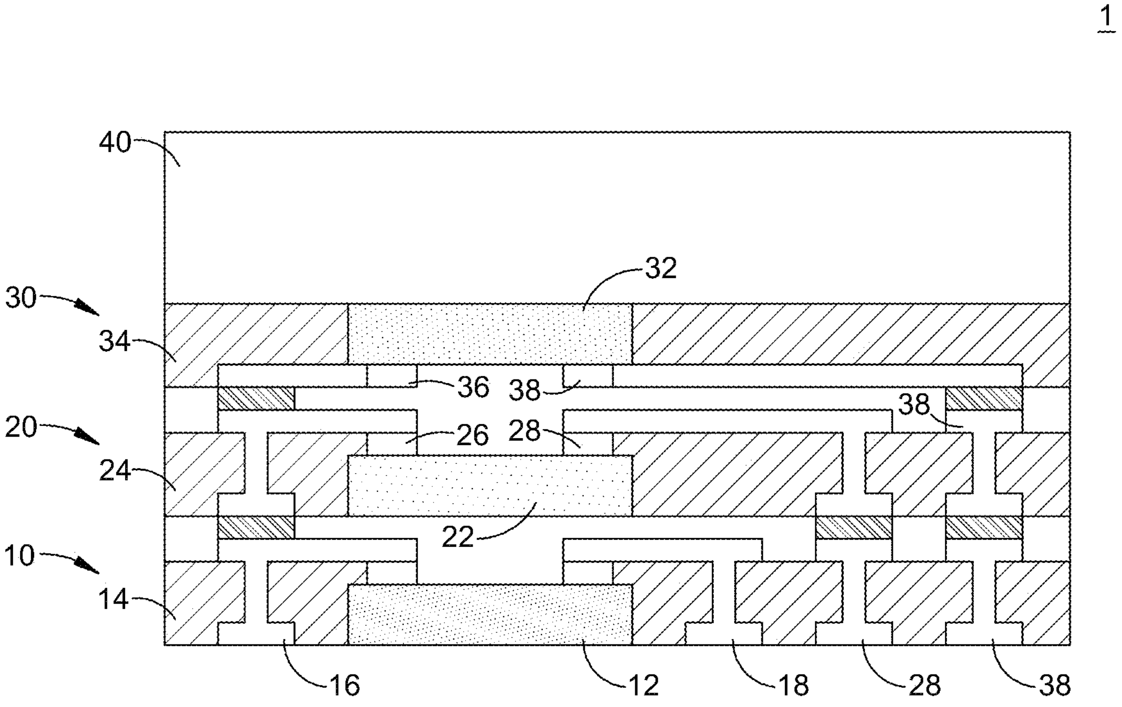
FIG. 2 is a schematic drawing showing structure of a second embodiment according to the present invention.

Refer to FIG. 2, another embodiment which is formed based on the above embodiment with the third insulating layer 34 is provided. In this embodiment, the first common electrode 16 and the first fan-out electrode 18 extend through the first insulating layer 14 from an upper side of the first insulating layer 14. The second common electrode 26 and the second fan-out electrode 28 extend through the second insulating layer 24 from an upper side of the second insulating layer 24 and then the second fan-out electrode 28 further extends through the first insulating layer 14. The third common electrode 36 and the third fan-out electrode 38 extend through a lower side of the third insulating layer 34. The rest components of this embodiment are the same as the above embodiment and there is no more detailed description.

Figure 3:
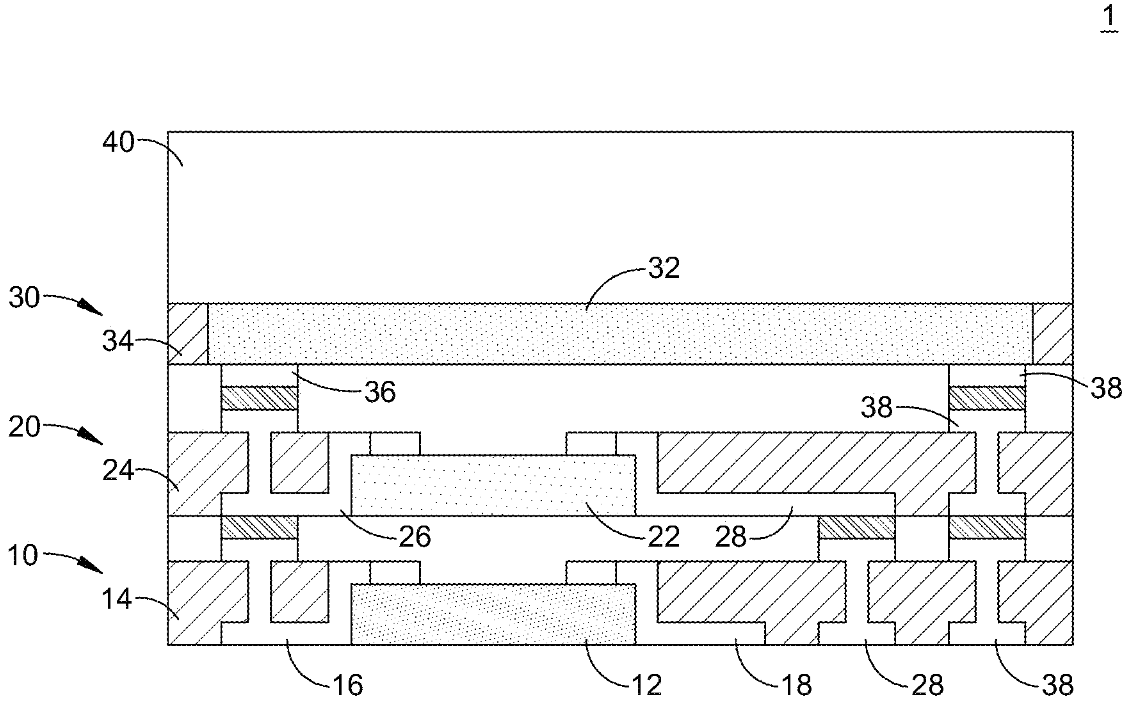
FIG. 3 is a schematic drawing showing structure of a third embodiment according to the present invention.

Refer to FIG. 3, a schematic drawing showing structure of a third embodiment is provided. As shown in the figure, this embodiment is based on the first embodiment mentioned above. In this embodiment, an area of the third light emitting element 32 of the third light emitting layer 30 is larger not only than an area of the first light emitting element 12 of the first light emitting layer 10, but also than an area of the second light emitting element 22 of the second light emitting layer 20. Thereby brightness of light emitted from the third light emitting element 32 is improved. For example, when the third light emitting element 32, the first light emitting element 12, and the second light emitting element 22 are respectively blue LED, red LED, and green LED, brightness of light emitted from the third light emitting element 32 which emits blue light is lower. Thus the area of the third light emitting element 32 is increased for adjustment of its brightness. The rest components of this embodiment are the same as the above embodiment and there is no more detailed description.

Figure 4A:
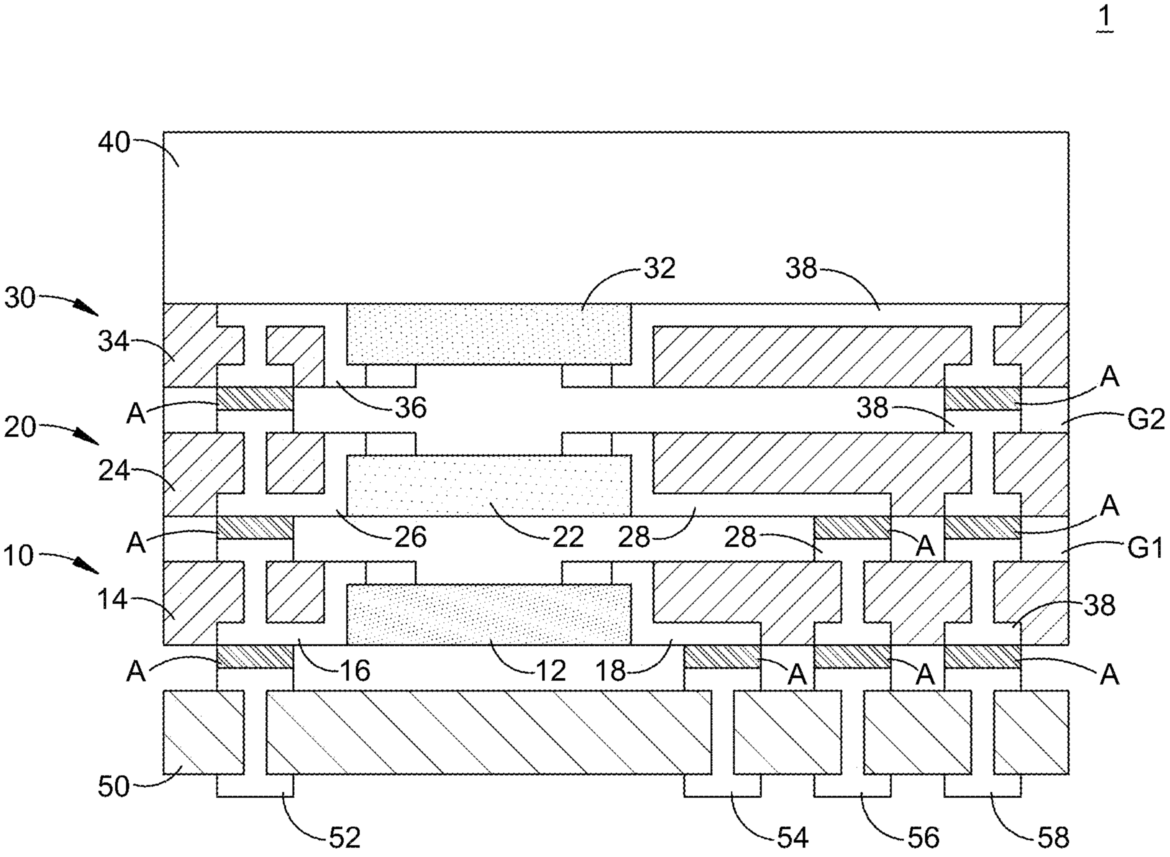
FIG. 4A-4C are schematic drawings showing structure of a further embodiment according to the present invention.
Figure 4B:
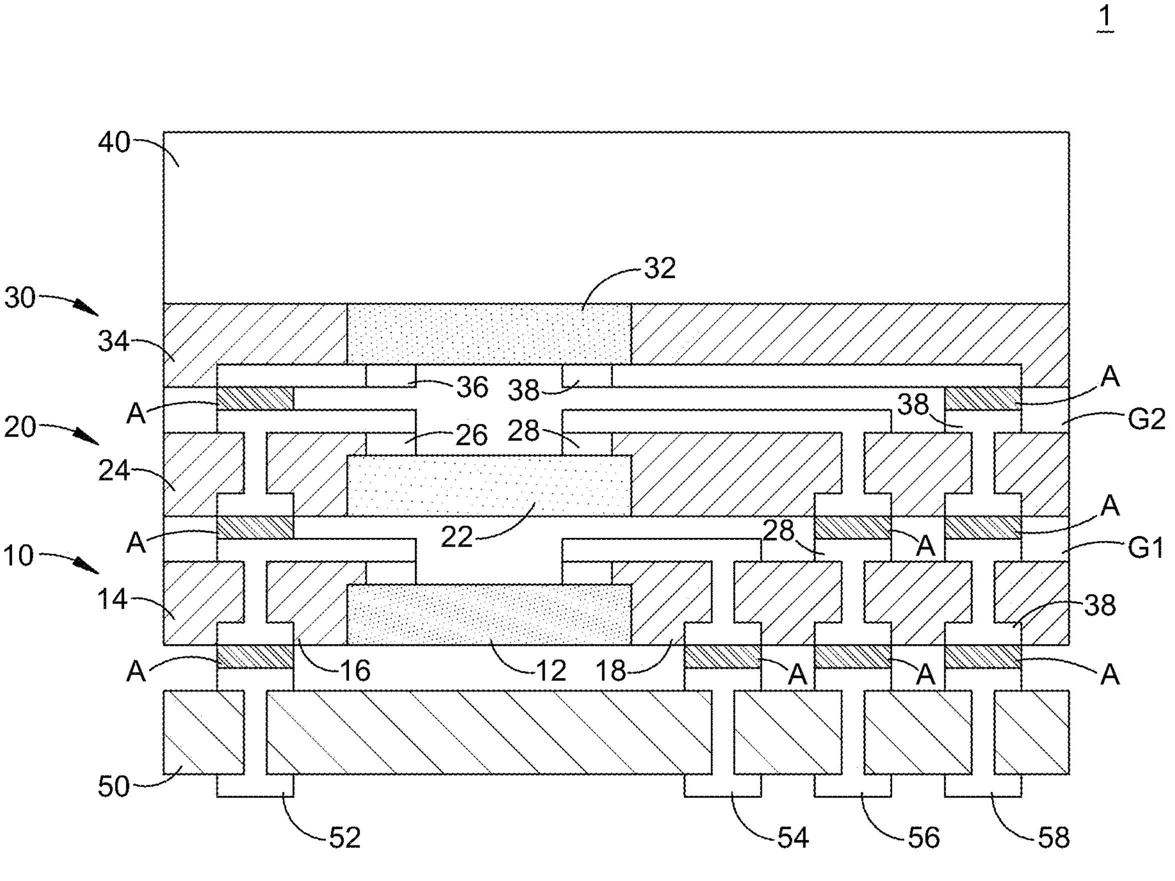
Figure 4C:
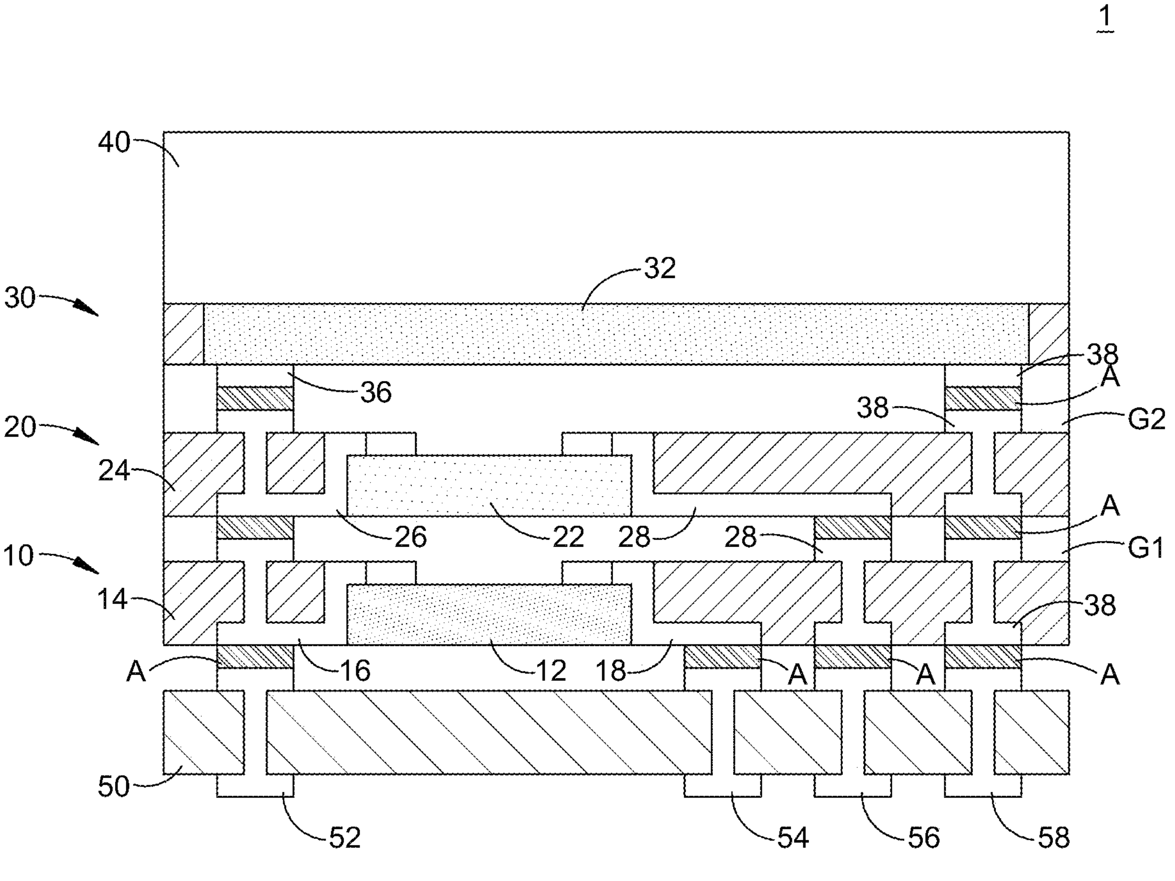

Refer to FIG. 4A-4C, a further embodiment is provided. This embodiment is modified based on the first embodiment, the second embodiment, or the third embodiment mentioned above. In this embodiment, the stacked light emitting device 1 further includes a lower substrate 50 which is arranged under the first light emitting layer 10. The lower substrate 50 is composed of a common substrate electrode 52, a first substrate electrode 54, a second substrate electrode 56, and a third substrate electrode 58 which are respectively electrically connected with the first common electrode 16, the first fan-out electrode 18, the second fan-out electrode 28, and the third fan-out electrode 38.

In a preferred embodiment, the first light emitting layer 10, the second light emitting layer 20, and the third light emitting layer 30 are firstly stacked with one another and then disposed over the lower substrate 50 to reduce manufacturing cost of the stacked light emitting device 1.

Refer to FIG. 4A-4C again, as shown in the figure, this embodiment is formed based on the first embodiment, the second embodiment, or the third embodiment mentioned above. In this embodiment, a conductive member A is disposed between the first common electrode 16 and the second common electrode 26. Another conductive member A is arranged between the second common electrode 26 and the third common electrode 36. By the conductive member A between the first common electrode 16 and the second common electrode 26, the first light emitting layer 10 and the second light emitting layer 20 are electrically connected correspondingly while being joined with each other. By the conductive member A between the second common electrode 26 and the third common electrode 36, the second light emitting layer 20 and the third light emitting layer 30 are electrically connected correspondingly while being joined with each other.

In this embodiment, the conductive member A is made of tin (Sn), indium (In), gold-tin alloy (AuSn), tin-silver-copper (SAC), or Anisotropic Conductive Film (ACF).

In a preferred embodiment, a further conductive member A is disposed between the second fan-out electrode 28 located at the second light emitting layer 20 and the second fan-out electrode 28 located at the first light emitting layer 10. Similarly, a further conductive member A is arranged between the third fan-out electrode 38 located at the third light emitting layer 30 and the third fan-out electrode 38 located at the second light emitting layer 20. A further conductive member A is disposed between the third fan-out electrode 38 located at the second light emitting layer 20 and the third fan-out electrode 38 located at the first light emitting layer 10. The first light emitting layer 10, the second light emitting layer 20, and the third light emitting layer 30 are electrically connected by the plurality of the conductive members A while being joined with one another. The rest components of this embodiment are the same as the above three embodiments and there is no more detailed description.

In a preferred embodiment and the above embodiments with the first transparent gel layer G1 and the second transparent gel layer G2, the first transparent gel layer G1 and the second transparent gel layer G2 are made of Anisotropic Conductive Film (ACF). The conductive member A is a plurality of conductive particles in ACF.

In the above embodiments, the first light emitting layer 10, the second light emitting layer 20, the third light emitting layer 30, and the upper substrate 40 can be respectively produced into thin films and then aligned and attached correspondingly. For example, ACF is used to attach and fix the electrodes electrically connected and corresponding to each other.

In the above embodiments, the electrodes can be made of copper, nickel, gold or aluminum, but not limited.

In summary, a stacked light emitting device is provided. The stacked light emitting device includes a light emitting layer composed of a light emitting element and an insulating layer. Another light emitting layer is stacked over the light emitting layer to achieve vertical stacking. The light emitting elements of the respective light emitting layers share one electrode while the other electrodes of the respective light emitting layers are extending through the insulating layers to achieve vertically conductive and stacked electrodes for transmitting electrical signals of the respective light emitting layers to the same plane. Not only the whole area is reduced, production speed is also increased. Thereby the problem of conventional micro LED with certain area unable to be minimized can be solved.

The present invention meets requirements for patentability including novelty, non-obviousness and usefulness.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalent.

The invention claimed is:

1. A stacked light emitting device comprising:
- a first light emitting layer having:
  - a first light emitting element;
  - a first insulating layer covering an outer side of the first light emitting element;
  - a first common electrode electrically connected to an upper side of the first light emitting element and extending through the first insulating layer to be arranged at a lower side of the first insulating layer; and
  - a first fan-out electrode electrically connected to the upper side of the first light emitting element and extending through the first insulating layer to be disposed at the lower side of the first insulating layer;
- a first transparent gel layer disposed over the first light emitting layer;
- a second light emitting layer arranged over the first transparent gel layer and having:
  - a second light emitting element,
  - a second insulating layer covering an outer side of the second light emitting element,
  - a second common electrode electrically connected to an upper side of the second light emitting element and extending through the second insulating layer to be electrically connected with the first common electrode, and
  - a second fan-out electrode electrically connected to the upper side of the second light emitting element and extending through the first insulting layer and the second insulating layer to be disposed on the lower side of the first insulating layer;
- a second transparent gel layer disposed over the second light emitting layer;
- a third light emitting layer arranged over the second transparent gel layer and including:
  - a third light emitting element,
  - a third common electrode electrically connected to a lower side of the third light emitting element and electrically connected with the second common electrode, and
  - a third fan-out electrode electrically connected to the lower side of the third light emitting element and extending through the first insulting layer and the second insulating layer to be disposed on the lower side of the first insulating layer; and
- an upper substrate arranged over the third light emitting layer.

2. The stacked light emitting device as claimed in claim 1, wherein the third light emitting layer further includes a third insulating layer covering an outer side of the third light emitting element; wherein the third fan-out electrode extends through the first insulting layer, the second insulating layer, and the third insulating layer to be disposed on the lower side of the first insulating layer.

3. The stacked light emitting device as claimed in claim 2, wherein the third common electrode extends through the third insulating layer.

4. The stacked light emitting device as claimed in claim 2, wherein the first insulting layer, the second insulating layer, and the third insulating layer are made of a material selected from the group consisting of polyimide (PI), benzocyclobutene (BCB), polybenzoxazole (PBO), and a combination thereof.

5. The stacked light emitting device as claimed in claim 1, wherein an area of the third light emitting element is larger than both an area of the first light emitting element and an area of the second light emitting element.

6. The stacked light emitting device as claimed in claim 1, wherein the stacked light emitting device further includes a lower substrate which is arranged under the first light emitting layer; the lower substrate is composed of a common substrate electrode, a first substrate electrode, a second substrate electrode, and a third substrate electrode which are respectively electrically connected with the first common electrode, the first fan-out electrode, the second fan-out electrode, and the third fan-out electrode.

7. The stacked light emitting device as claimed in claim 1, wherein a conductive member is disposed between the first common electrode and the second common electrode and another conductive member is arranged between the second common electrode and the third common electrode.

8. The stacked light emitting device as claimed in claim 6, wherein a further conductive member is disposed between the second fan-out electrode located at the second light emitting layer and the second fan-out electrode located at the first light emitting layer; a further conductive member is arranged between the third fan-out electrode located at the third light emitting layer and the third fan-out electrode located at the second light emitting layer; a further conductive member is disposed between the third fan-out electrode located at the second light emitting layer and the third fan-out electrode located at the first light emitting layer.

9. The stacked light emitting device as claimed in claim 7, wherein the first transparent gel layer, the second transparent gel layer, and the conductive members are made of Anisotropic Conductive Film (ACF).

10. The stacked light emitting device as claimed in claim 1, wherein the upper substrate is made of transparent materials.

* * * * *